United States Patent [19]

Trussell, Jr. et al.

[11] 4,371,968

[45] Feb. 1, 1983

[54] MONOLITHIC INJECTION LASER ARRAYS FORMED BY CRYSTAL REGROWTH TECHNIQUES

[75] Inventors: C. Ward Trussell, Jr., Woodbridge; James E. Miller, Springfield, both of Va.

[73] Assignee: The United States of America as represented by the Secretary of the Army, Washington, D.C.

[21] Appl. No.: 279,394

[22] Filed: Jul. 1, 1981

[51] Int. Cl.³ .................... H01S 3/19; H01L 21/208
[52] U.S. Cl. .................................. 372/50; 29/569 L; 148/171
[58] Field of Search ............... 148/171, 172; 372/50, 372/64; 329/569 L

[56] References Cited

U.S. PATENT DOCUMENTS

| | | | |
|---|---|---|---|
| 4,033,796 | 7/1977 | Burnham et al. | 148/171 X |
| 4,122,407 | 10/1978 | Van Vechten | 148/171 X |
| 4,188,244 | 2/1980 | Itoh et al. | 148/171 X |
| 4,213,805 | 7/1980 | Tsukada | 48/171 |
| 4,251,298 | 2/1981 | Thompson | 148/171 |

OTHER PUBLICATIONS

Blum et al., IBM T.D.B., vol. 15, No. 7, Dec. 1972, p. 2345.
Burnham et al., Xerox Disclosure Journal, vol. 4, No. 3, May–Jun. 1979, pp. 357 and 358.

*Primary Examiner*—G. Ozaki
*Attorney, Agent, or Firm*—Nathan Edelberg; Milton W. Lee; Max L. Harwell

[57] ABSTRACT

A monolithic laser optical cavity structure and method of forming by use of planar photolithographic and crystal regrowth techniques. An original growth multilayer double heterostructure laser structure is grown by LPE on a N+-GaAs substrate. V-grooves are then etched in the epitaxial layers down through the optical cavity by photolithographic techniques. GaAlAs is grown in the V-grooves by crystal regrowth techniques up to the original surface of the laser wafer thus isolating the lasers from each other. The lasers are then separated to form laser arrays.

11 Claims, 5 Drawing Figures

MONOLITHIC INJECTION LASER ARRAYS FORMED BY CRYSTAL REGROWTH TECHNIQUES

The invention described herein may be manufactured, used, and licensed by the U.S. Government for governmental purposes without the payment of any royalties thereon.

BACKGROUND OF THE INVENTION

1. Field of the Invention

The invention is in the field of injection laser arrays and more particularly in heterostructure GaAs-GaAlAs lasers and the method of forming by use of planar photolithographic and crystal regrowth techniques.

2. Description of the Prior Art

Individual injection laser devices are inherently limited in output power by the peak power which can be emitted per unit area of the laser facet. In order to obtain higher output power many individual laser devices may be mounted in a common structure to form an array. Generally, mounting many individual laser devices in a common structure is a tedious and costly procedure not lending itself to mass production techniques. The present inventive method and the resulting apparatus affords mass production techniques.

SUMMARY OF THE INVENTION

The present invention makes fabrication of monolithic laser array structures more efficient and uses crystal regrowth techniques with standard planar photolithography in the process. An original growth multilayer double heterostructure laser structure is grown by liquid phase epitaxy (LPE), or other means, on a GaAs substrate. The laser wafer is then coated with photoresist and is exposed with a pattern of stripes using photolithographic techniques so that moats, stated as V-grooves herein, are etched in the epitaxial layers of the original growth using a preferential etch down through the optical cavity of the lasers. These V-grooves are preferably spaced either 1 mil or 10 mils apart to form an array of either 1 mil or 10 mil wide lasers. It should be noted that for more power production without lateral current flow the V-grooves may be spaced up to about 15 mils apart. The photoresist materials are then removed, the laser wafers are carefully cleaned and placed in a furnace. GaAlAs is then grown by crystal regrowth techniques in one or more layers in the V-grooves preferably by LPE techniques, up to the original surface, thus isolating the lasers from each other while also protecting the inner layers from shorting or sustaining damage in subsequent processing. The GaAlAs grown V-grooves act as both optical and electrical isolators between adjacent lasers.

The process and resulting monolithic injection laser array will be better understood by referring to the following description and claims taken in view of the following drawings.

DETAILED DESCRIPTION OF THE PREFERRED EMBODIMENT

Figure 1:
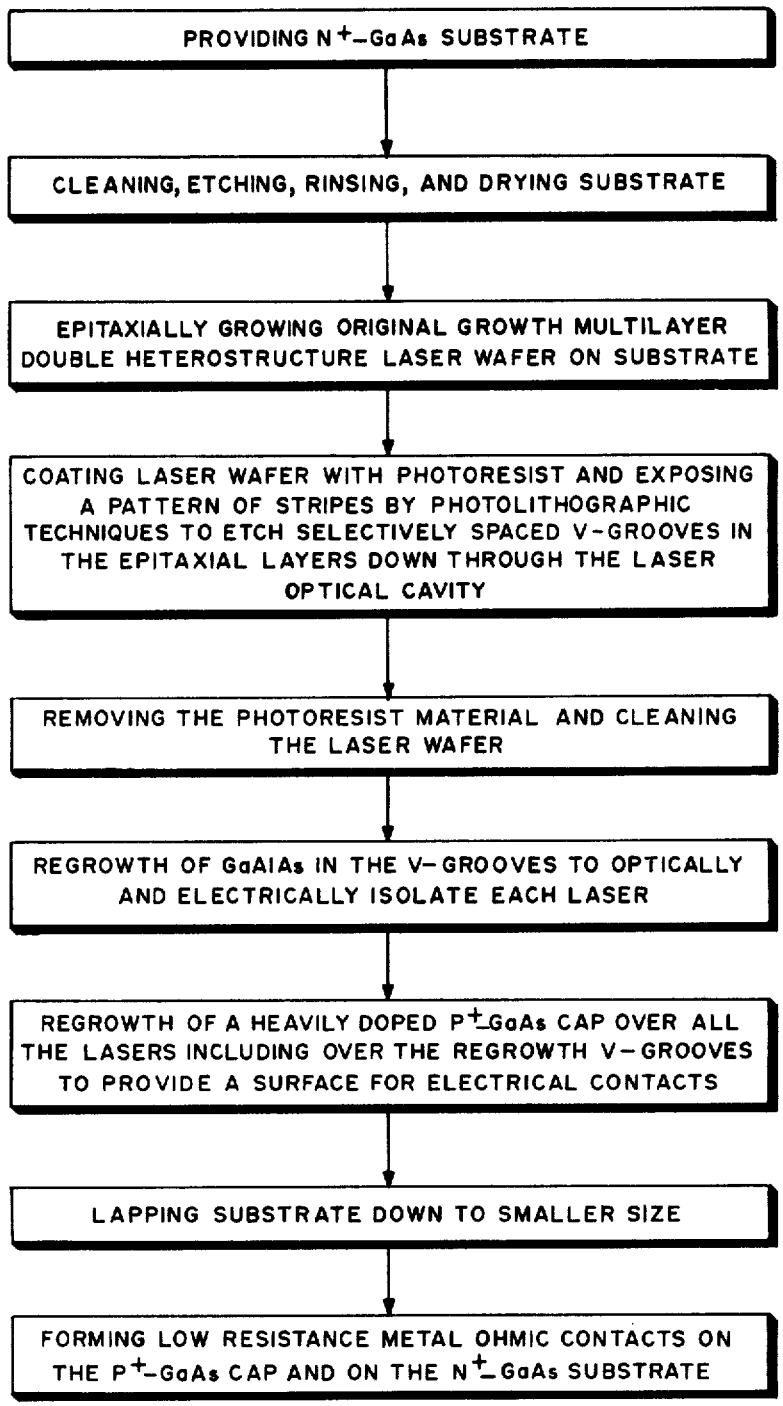
FIG. 1 illustrates by flow chart the steps of forming the monolithic injection laser array by crystal regrowth techniques.
Figure 2:
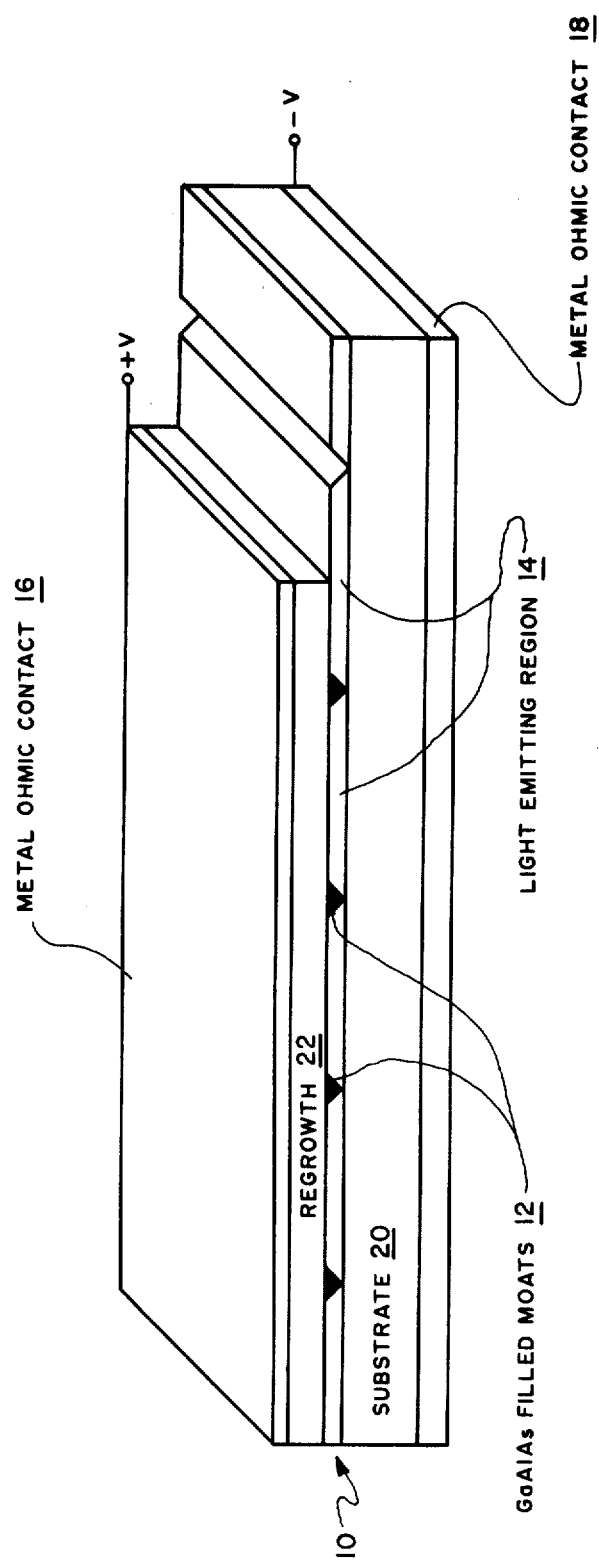
FIG. 2 illustrates a monolithic GaAlAs laser array.
Figure 5:
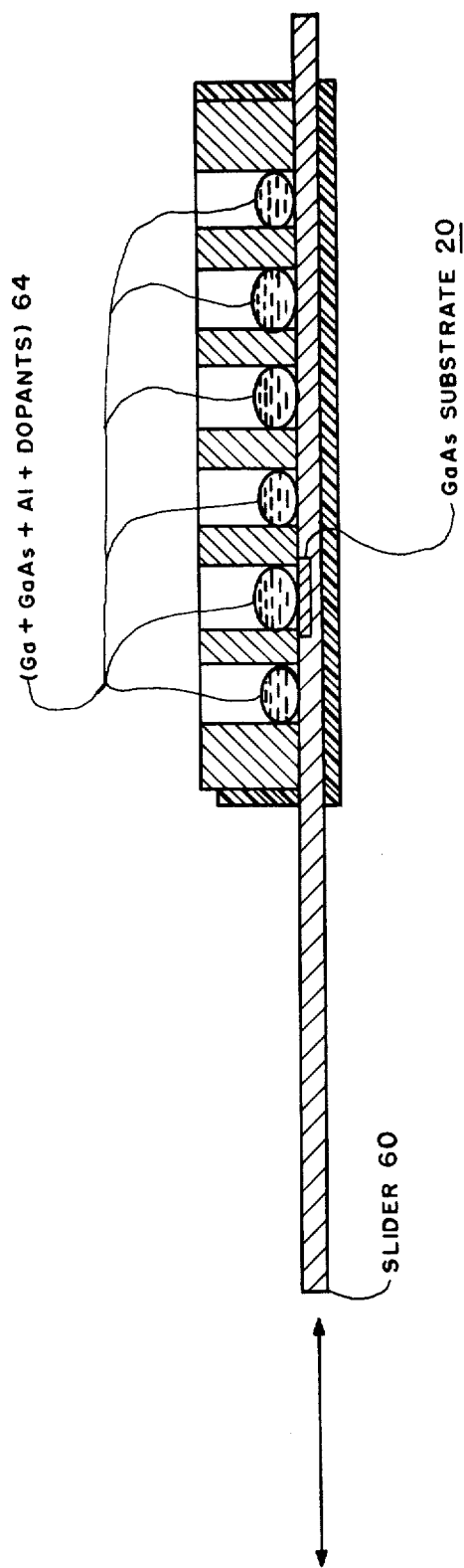
FIG. 5 illustrates a cross-sectional view of a typical graphite boat used in the LPE growth.

Refer to FIGS. 1, 2, and 5 for an explanation of the photolithographic and crystal regrowth techniques used in forming the monolithic injection laser arrays of the present invention. FIG. 1 illustrates by flow chart the steps of the process. FIG. 5 shows by cross-section the graphite boat container having a plurality of bins, or compartments, with each bin containing the selected elements, represented by numeral 64, used in epitaxially growing each of the many layers of the original growth by the LPE process. Slider 60 extends outside the graphite boat container and has the GaAs substrate 20 mounted thereon for sliding and positioning under the various bins containing the proper mixture of elements 64, comprised of Ga, GaAs, Al, and necessary dopants. The graphite boat container is also used in the crystal regrowth steps in the same manner. FIG. 2 illustrates a perspective view of a portion of the finished monolithic GaAlAs laser array having a cutaway on the right side showing a V-groove in the original growth.

Figure 3:
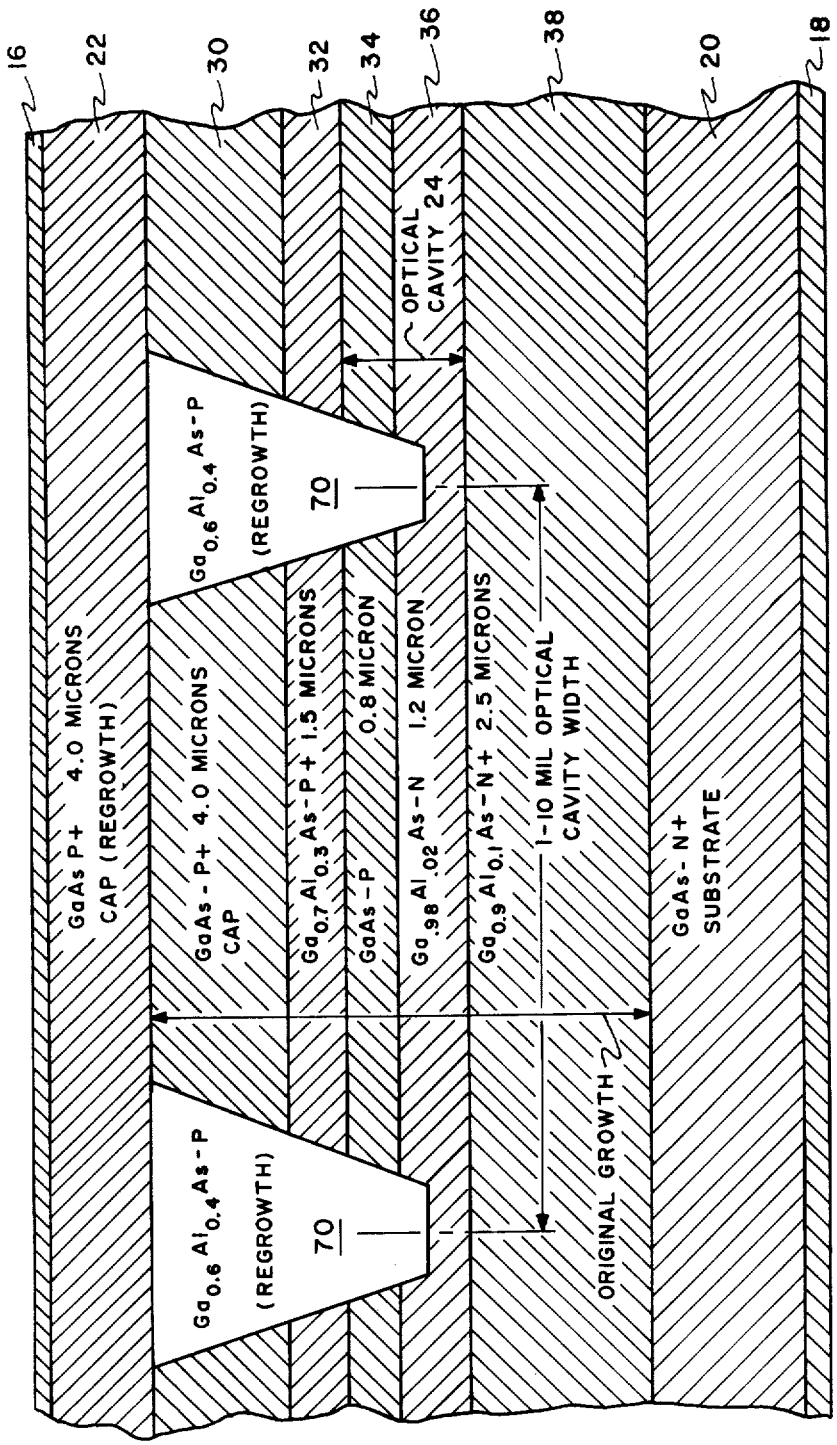
FIG. 3 illustrates one embodiment of the present invention in a two-layer regrowth.
Figure 4:
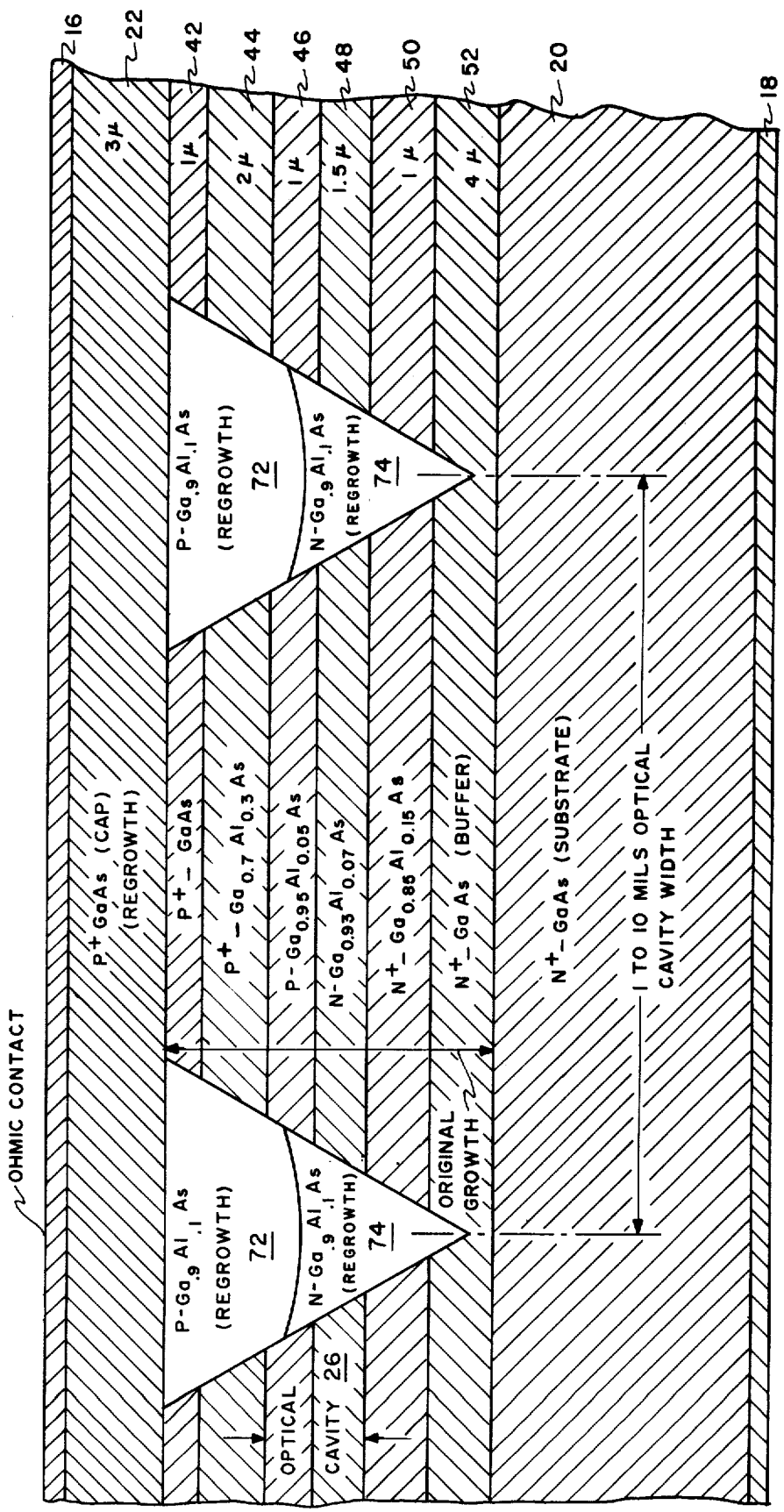
FIG. 4 shows a three-layer regrowth of the present GaAlAs laser array.

FIGS. 3 and 4 illustrate two different levels of regrowth included in the present invention. Namely, FIG. 3 illustrates a two layer crystal regrowth and FIG. 4 illustrates a three layer crystal regrowth. It should be noted that the crystal regrowth layers include the layer or layers grown in the V-grooves plus the P$^\pm$GaAs cap 22. Further, FIG. 3 has a five layer double heterostructure laser structure and FIG. 4 has a six layer double heterstructure laser structure.

Look now more closely at FIGS. 1 and 2 for use in explaining the process of forming the monolithic injection laser arrays of the present invention. In accordance with the present invention, the monolithic injection laser array 10 is formed by epitaxially growing, by liquid phase epitaxy (LPE) an original growth multilayered double heterostructure of GaAs and GaAlAs, or almost any semiconductor laser structure involving other ternary or quaternary combinations of Group III and Group V materials, on a N+-GaAs substrate 20, or other Group III-V semiconductor. The double heterostructure is shown as the light emitting region 14 in FIG. 2. Moats 12, which are also called V-grooves in this application, are selectively formed in the epitaxial layers of the multilayered double heterostructure laser wafer by photolithographic techniques. That is, the laser wafer is coated with photoresist and is exposed to a pattern of stripes 1 mil up to 15 mils apart, but preferably 1 mil or 10 mils apart, by the photolithographic techniques to etch V-grooves 12 in the epitaxial layers of the original growth down through the optical cavity of the laser wafer. To get the V-grooves the GaAs laser wafers must be (100) orientation and the grooves must be aligned parallel to the (001−) edge. The photoresist used was Shipley AZ1350J positive photoresist, but almost any photoresist compatible with the etch could be used. The photoresist material is next removed and the laser wafer is cleaned. The photoresist is preferably removed with Shipley AZ photoresist remover and is cleaned by rinsing in acetone and drying with $N_2$ gas. Before starting the regrowth steps the wafer is cleaned with hot trichloroethylene, is etched for 5 seconds in a solution of 5 H$_2$O$_2$:1H$_2$O, rinsed in distilled water, dried with N$_2$, and loaded in the furnace in less than 2 minutes.

The next step in forming the monolithic injection laser arrays is the crystal regrowth by LPE of GaAlAs in the V-grooves to optically and electrically isolate each laser of the array. This regrowth is indicated in FIG. 2 by numeral 12, and represents GaAlAs filled V-grooves. The percentage of the AlAs regrown in the V-grooves should be greater than the percentage of AlAs in the active layers in the original growth and is typically 10% to 40% AlAs in the crystal regrowth. It was found that the GaAlAs materials grow faster in the V-grooves than on the top of the laser wafer such that very little, or none, of the GaAlAs grows on the flat surfaces. Crystal regrowth is continued by LPE over the laser wafer by growing a heavily doped P+-GaAs cap 22 for a sufficient time to cover the top surface, including over the crystal regrowth filled V-grooves 12. The P+-GaAs cap is grown to provide a surface for electrical contacts. A positive electrical metal ohmic contact 16 is deposited on the P+-GaAs cap 22, and may be a low resistance gold layer. A negative electrical metal ohmic contact 18 is deposited on the N+GaAs substrate 20 after lapping the substrate down to about 3 mils total thickness. Contact 18 is also preferably a low resistance gold layer.

The LPE growth of the multilayer double hetertructure laser wafer and the regrowth of the filled V-grooves and the cap will be better understood by reference to FIG. 5 which shows the carbon growth reactor machined from high density graphite that is used in the LPE growth steps. Each bin in the high density graphite container contains the proper combination of elements for each layer that is epitaxially grown on substrate 20 as the substrate is moved under each bin by movement of slider 60. The thickness of each grown layer is controlled by the time that the substrate 20 is under the bin. It should be noted that Ga and enough GaAs to saturate the solution at the growth temperature are added to each bin or compartment. A precise amount of Al and the dopants required for each layer are also added to appropriate bins. The steps of cleaning, etching, rinsing, and drying the GaAs substrate 20 are as follows. The substrate is cleaned in hot tricholorethylene, is etched in 5 H$_2$SO$_4$: 1 H$_2$O$_2$: 1 H$_2$O, is rinsed in distilled water, and is dried with N$_2$ gas. The substrate 20 is then placed in the slot in the slider 60. The loaded growth reactor is then loaded in the furnace and the air is pumped out with a sorption pump. Pure hydrogen gas at slightly above atmospheric pressure flows over the boat as it is heated to 830° C., which is the growth temperature. The original growth layers are grown by cooling at 0.1° C. per minute and sliding the substrate 20 under each growth solution for the proper amount of time. Typical layer thicknesses are as shown in FIGS. 3 and 4, but the thickness are not critical to the monolothic process and are not limited to the thicknesses shown.

A typical GaAs substrate 20 size is 0.60 inch ×0.70 inch, is n-type, 1 to 3×10$^{18}$ carriers/cc, silicon doped, single crystal, has less than 3000 dislocations/cm$^2$, is cut on (100)plane ±½ degree, is lapped and polished on one side, and is 15± 1 mils thick originally.

It should be noted that other laser structures produced by LPE, molecular beam epitaxy, vapor phase epitaxy, chemical vapor deposition or other techniques could be processed by the present regrowth techniques.

The regrowth steps of GaAlAs in the V-grooves and the heavily doped P+-GaAs cap layer 22 are done in the same growth reactors and furnaces as the original growth multilayer double heterostructure laser wafer. The bins themselves however are removed and have the new elements, used for the crystal regrowth steps, placed therein. The laser wafer is taken out of the furnace, cooled to room temperature, cleaned and etched between the original growth and the crystal regrowth steps. The most critical function of the regrowth step is controlling the amount of growth in the V-grooves. To control the growth of material in the V-grooves, the melt or solution must be slightly oversaturated with the presence of GaAs when growth is begun. If the solution is undersaturated, the V-grooves will be enlarged in an uncontrolled fashion. If the solution is too much oversaturated, the V-grooves will be overfilled immediately and some growth of the material at the V-groove will occur on the top surface. The furnace must approach the growth temperature of 830° C. with no overshoot and be stable at that temperature within 0.1° C. for at least 30 minutes. The furnace and reactor are then cooled 0.2° C. before the laser wafer is moved under the solution. The furnace continues to cool at 0.1° C. per minute for the time required to fill the V-grooves. It should be noted here that in the embodiment of FIG. 4 there are two separate fillings of the V-groove of about one-half filling for each. The first is a N-Ga$_{0.9}$Al$_{0.1}$As regrowth 74 and the second filling is a P-Ga$_{0.9}$Al$_{0.1}$As regrowth 72. The embodiment of FIG. 3 however fills the V-grooves totally at the 0.1° C. per minute cooling with the Ga$_{0.6}$Al$_{0.4}$As-P regrowth layer 70 as illustrated. In either embodiment, when the V-grooves are filled, the P+-GaAs cap 22 is immediately grown by moving the laser wafer on slide 60 under the GaAs and the P+ dopant for a sufficient time to cover the surface with a layer of approximately 3 to 4 microns.

FIG. 3 illustrates by a cross-sectional side view the two-layer regrowth monolithic injection laser array and the process of forming the array on an original growth five-layer double heterostructure laser structure. The first regrowth layer is comprised of a specific regrowth layer 70 in the V-groove, in this case a P-Ga$_{0.6}$Al$_{0.4}$As layer. The second regrowth layer is the P+-GaAs cap layer 22, which is preferably about 4 microns thick. Typical layer dopings and their thicknesses of the five-layer double heterostructure are as shown in FIG. 3. Grown upon the N+-GaAs substrate 20 is a N+-Ga$_{0.9}$Al$_{0.1}$As first layer 38 of about 2.5 microns thickness. The second and third layers form the optical cavity 24, i.e., the active layers, and are comprised of a second layer 36 of N-Ga$_{0.98}$Al$_{0.02}$As of about 1.2 microns thick and a third layer 34 of P-GaAs of about 0.8 micron thick. A fourth layer 32, contiguous with the third layer 34, of P+-Ga$_{0.7}$Al$_{0.3}$As is about 1.5 microns thick. The fifth layer 30, contiguous with the fourth layer 32, of P+-GaAs is about 4 microns thick. These five layers, which form the original growth, are grown in the furnace, preferably by LPE techniques. The V-grooves, which are etched away by the selectively etching step, are filled by regrowth layer 70.

FIG. 4 illustrates by a cross-sectional side view the three-layer regrowth monolithic injection laser array and the process of forming the array on an original growth six-layer double heterostructure laser structure. In this embodiment there are two regrowth layers within the V-grooves and then the P+-GaAs cap regrowth layer 22 which is grown over the laser wafer surface including over the second regrowth layer 72 within the V-grooves. The first regrowth layer within the V-grooves is represented by numerals 74. In this embodiment, the typical layer dopings and their thicknesses of the six-layer double heterostructure are as shown in FIG. 4. A N+-GaAs buffer layer 52 of about 4 microns thickness is grown as the first layer upon substrate 20. Second layer 50 of N+-$Ga_{0.85}Al_{0.15}As$ is grown to about 1 micron thickness on the buffer layer 52. Third and fourth layers 48 and 46 respectively form the optical cavity 26, or the active layers. The third layer 48 of N-$Ga_{0.95}Al_{0.05}As$ is grown to about 1.5 microns thick on second layer 50. Grown on the third layer 48 is fourth layer 46 of P-$Ga_{0.95}Al_{0.05}As$ of about 1 micron thickness. A fifth layer 44 grown on layer 46 is comprised of P+-$Ga_{0.7}Al_{0.3}As$ about 2 microns thick. The sixth layer 42 is comprised of P+-GaAs about 1 micron thick. V-grooves are then formed by the selective etching step. After the selective etching step, the first regrowth layer 74 of N-$Ga_{0.9}Al_{0.1}As$ is grown to partially fill the V-grooves and the second regrowth layer 72 of P-$GA_{0.9}Al_{0.1}As$ fills the remainder of the V-grooves. The depths of layers 74 and 72 are determined according to the position of the P-N junction in the original growth. That is, the N-type first regrowth layer 74 fills up in P-type fourth layer 46 of the original growth.

An explanation as to the difference between the two and three layered regrowths is as follows. It should be noted that the times required to obtain the desired regrowths are experimentally determined and also depend on the depth that the V-grooves are etched by the etching step. Refer now to the two-layer regrowth as illustrated by FIG. 3. The bottom of the V-groove must be down into the N-layer, i.e., layer 36, of the optical cavity 24. If the regrowth layer 70 in the V-groove is not deep enough into the P-GaAs layer 34, the regrowth layer 70 will not be effective in confining the lasing modes in a direction parallel to the V-grooves. If the V-groove extends down into the N+-$Ga_{0.9}Al_{0.1}As$ layer 38, the regrowth step of layer 70 will be difficult. If the V-groove extends all the way down into substrate 20, the laser array will be less efficient because some current will be conducted directly to the N±GaAs substrate 20 through the P-$Ga_{0.6}Al_{0.1}As$ regrowth layer 70.

In the three-layer regrowth process illustrated by FIG. 4, the percentages of GaAs and AlAs in the original growth are different and thus the two-layer regrowth process is not appropriate. In this case, the AlAs amount is greater than 2%. When the active layers of the laser device contain more than 2% AlAs as in laser structures designed to operate at shorter wavelengths, i.e., less than about 8700 Å, it is difficult to start regrowth in the active layers. In order to get reproducible and complete regrowth it is necessary to etch the V-grooves down through the active layers to N+-GaAs material, such as the substrate or buffer layers 20 or 52 respectively. It should be noted that buffer layer 52 deposited on substrate layer 20 helps to smooth out defects but is not essential. This process may be appropriate with laser devices having GaAs active layers in which the advantage is that the depth of etching is not so critical. In this embodiment, the first regrowth layer 74 must be N-doped, preferably N-$Ga_{0.9}Al_{0.1}As$, and the second regrowth layer 72 must be P-doped, preferably P-$Ga_{0.9}Al_{0.1}As$, to keep substantial current from flowing through the filled V-grooves in the finished laser array. The N-$Ga_{0.9}Al_{0.1}As$ layer 74 regrowth material must fill the bottom of the V-groove so that the P-$Ga_{0.9}Al_{0.1}As$ layer 72 regrowth material does not contact the N+-GaAs material. Likewise, the N-$Ga_{0.9}Al_{0.1}As$ layer 74 regrowth material should not contact the P±GaAs material of fifth layer 42 of the five-layer double heterostructure of the original growth. The reason for this is because a P-N junction involving GaAs will conduct current at a lower forward voltage than the laser device P-N junctions involving GaAlAs, resulting in possible wasted current in the V-grooves and reducing the efficiency of the laser array.

While the present process for forming a monolithic injection laser array has been explained using GaAs substrates and GaAlAs original and regrowth layers, injection laser structures may be made using other ternary or quaternary combinations of Group III and Group V materials or Group IV and Group VI materials. Two examples of other Group III–V materials that may be used, but not limited thereto, are in a quaternary combination of InP as the substrate and GaInAsP as the original and regrowth layers and a ternary combination of GaAs as the substrate and GaAsP as the original and regrowth layers. Two examples of Group IV–VI materials that may be used, and also not limited thereto, are a PbTe substrate and PbSnTe original and regrowth layers or a PbS substrate and PbSSe original and regrowth layers.

We claim:

1. A process for forming a monolithic injection laser array, the steps comprising:
   cleaning, etching, rinsing, and drying an N+-GaAs substrate;
   epitaxially growing an orginal growth multilayer double heterostructure GaAlAs laser wafer on said substrate;
   selectively etching V-grooves in the epitaxial layers down through the optical cavity of the laser;
   preparing said laser wafer for crystal regrowth;
   regrowing by crystal regrowth GaAlAs in said V-grooves to optically and electrically isolate each adjacent laser;
   regrowing by crystal regrowth a heavily doped P±GaAs cap over all the lasers in the laser array including over said crystal regrowth GaAlAs in said V-grooves;
   thinning said substrate by lapping; and
   depositing metal ohmic contacts on said P±GaAs cap and on the lapped N+-GaAs substrate to provide electrical connections to an external power source.

2. A process as set forth in claim 1 wherein said cleaning, etching, rinsing, and drying steps are comprised of cleaning in hot trichloroethylene, etching in 5 $H_2SO_4$: 1 $H_2O_2$: 1 $H_2O$ solution, rinsing in distilled water, and drying with $N_2$ gas.

3. A process as set forth in claim 2 wherein said step of epitaxially growing an original growth multilayer double heterostructure is comprised of placing said substrate on a slider in a graphite boat container within a furnace in which said container has a plurality of bins each containing the combination of elements that are epitaxially grown by liquid phase epitaxy as each layer of the plurality of multilayers of said original growth as said substrate is slid under each of said bins wherein air is first pumped out of said furnace and pure hydrogen gas at slightly above atmospheric pressure is flowed over said boat as it is heated to 830° C. and the original growth multilayers are grown as said furnace is cooled at 0.1° C. per minute wherein the thickness of each layer of the original growth multilayers is determined by the time said substrate remains under each bin containing each combination of elements.

4. A process as set forth in claim 3 wherein said step of selectively etching V-grooves is comprised of coating said laser wafer with a positive photoresist and exposing a pattern of stripes by photolithographic techniques for etching said V-grooves with an etch of from 3 to 8 parts $H_2SO_4$: 1 part $H_2O_2$: 1 part $H_2O$ by volume with said N+-GaAs substrate at (100) orientation and said V-grooves aligned parallel to the (001) edge wherein said positive photoresist is compatible with said etch.

5. A process as set forth in claim 4 wherein said step of preparing said laser wafer for crystal regrowth is by cleaning with hot trichloroethylene, etching for 5 seconds in an etch comprised of 5 parts $H_2SO_4$: 1 part $H_2O_2$: 1 part $H_2O$ by volume, rinsing in distilled water, drying with $N_2$ gas, and reloading in said furnace within 2 minutes after the drying step.

6. A process as set forth in claim 5 wherein said steps of regrowing by crystal regrowth techniques GaAlAs in said V-grooves and heavily doped P+-GaAs cap is comprised of reheating said furnace to 830° C. with no temperature overshoot and remain stable within 0.1° C. for at least 30 minutes and then cool said furnace 0.2° C. prior to sliding said laser wafer under said growth solution in which said solution is slightly oversaturated when regrowing step is begun wherein said furnace is cooled at 0.1° C. per minute during the step of regrowing GaAlAs in the V-grooves until said V-grooves are filled and wherein said step of regrowing a heavily doped P+-GaAs cap is continued by sliding said substrate under another bin for growing over all the surface of said laser wafer including over the filled V-grooves by continuing cooling said furnace at 0.1° C. per minute while growing said heavily doped P+-GaAs cap for sufficient time to cover the surface to about 3 microns thick.

7. A process as set forth in claim 6 wherein said step of epitaxially growing an original growth multilayer double heterostructure is comprised of growing a five layer double heterostructure having a first layer of N±$Ga_{0.9}Al_{0.1}As$ grown to about 2.5 microns thick grown on said N+-GaAs substrate and having second and third active layers that form said optical cavity wherein said second layer is N-$Ga_{0.98}Al_{0.02}As$ grown to about 1.2 microns thick and said third layer is P-GaAs grown to about 0.8 micron thick and a fourth layer of P±$Ga_{0.7}Al_{0.3}As$ grown to about 1.5 microns thick and a fifth layer of P+-GaAs grown to about 4 microns thick and wherein said step of regrowing by crystal regrowth GaAlAs in said V-grooves is comprised of growing a $Ga_{0.6}Al_{0.4}As$ regrowth in said V-grooves up to the surface.

8. A process as set forth in claim 6 wherein said step of epitaxially growing an original growth multilayer double heterostructure is comprised of growing a six layer double heterostructure having a first layer of N±GaAs buffer layer grown to about 4 microns thick and a second layer of N+-$Ga_{0.85}Al_{0.15}As$ grown to about 1 micron thick and having third and fourth active layers that form said optical cavity wherein said third layer is N-$Ga_{0.93}Al_{0.07}As$ grown to about 1.5 microns thick and said fourth layer is P-$Ga_{0.95}Al_{0.05}As$ grown to about 1 micron thick and a fifth layer of P±$Ga_{0.7}Al_{0.3}As$ grown to about 2 microns thick and a sixth layer of P+-GaAs grown to about 1 micron thick and wherein said step of regrowing by crystal regrowth GaAlAs in said V-grooves is comprised of growing a first regrowth of N-$Ga_{0.9}Al_{0.1}As$ filling about one half of said V-grooves and growing a second regrowth of P-$Ga_{0.9}Al_{0.1}As$ filling the remaining one half of said V-grooves up to the surface wherein said first regrowth is grown up to the P-type fourth layer of said optical cavity.

9. A monolithic injection laser array grown by the process of claims 7 or 8.

10. A process for forming a monolithic injection layer array, the steps comprising:
cleaning, etching, rinsing, and drying an N+-type Group III-V materials substrate;
epitaxially growing an original growth multilayer double heterostructure Group III-V materials laser wafer on said substrate;
selectively etching V-grooves in the epitaxial layers down through the optical cavity of the laser;
preparing said laser wafer for crystal regrowth;
regrowing by crystal regrowth Group III-V materials in said V-grooves to optically and electrically isolate each adjacent laser;
regrowing by crystal regrowth a heavily doped P+-type Group III-V materials cap over all the lasers in the laser array including over said crystal regrowth Group III-V materials in said V-grooves;
thinning said substrate by lapping; and
depositing metal ohmic contacts on said P+-type Group III-V materials cap and on the lapped N+-type Group III-V materials substrate to provide electrical connections to an external power source.

11. A process for forming a monolithic injection laser array, the steps comprising:
cleaning, etching, rinsing, and drying an N+-type Group IV-VI materials substrate;
epitaxially growing an original growth multilayer double heterostructure Group IV-VI materials laser wafer on said substrate;
selectively etching V-grooves in the epitaxial layers down through the optical cavity of the laser;
preparing said laser wafer for crystal regrowth;
regrowing by crystal regrowth Group IV-VI materials in said V-grooves to optically and electrically isolate each adjacent laser;
regrowing by crystal regrowth a heavily doped P+-type Group IV-VI materials cap over all the lasers in the laser array including over said crystal regrowth Group IV-VI materials in said V-grooves;
thinning said substrate by lapping; and
depositing metal ohmic contacts on said P+-type Group IV-VI materials cap and on the lapped N+-type Group IV-VI materials substrate to provide electrical connections to an external power source.

* * * * *